United States Patent
Tichauer (10) Patent No.: US 6,859,102 B2
(45) Date of Patent: Feb. 22, 2005

(54) AMPLIFIER CIRCUIT AND METHOD

(75) Inventor: Larry Martin Tichauer, La Palma, CA (US)

(73) Assignee: PowerQ Technologies, Inc., Newport Beach, CA (US)

( * ) Notice: Subject to any disclaimer, the term of this patent is extended or adjusted under 35 U.S.C. 154(b) by 0 days.

(21) Appl. No.: 10/259,182

(22) Filed: Sep. 26, 2002

(65) Prior Publication Data

US 2003/0117218 A1 Jun. 26, 2003

Related U.S. Application Data

(60) Provisional application No. 60/325,898, filed on Sep. 27, 2001.

(51) Int. Cl.[7] .................................................. H03G 3/30
(52) U.S. Cl. ........................................ 330/285; 330/284
(58) Field of Search .................................. 330/129, 136, 330/278, 279, 284, 285, 296

(56) References Cited

U.S. PATENT DOCUMENTS

| | | | |
|---|---|---|---|
| 5,017,811 A | | 5/1991 | Worley |
| 5,081,371 A | | 1/1992 | Wong |
| 5,119,042 A | * | 6/1992 | Crampton et al. .......... 330/285 |
| 5,206,544 A | | 4/1993 | Chen et al. |
| 5,287,555 A | * | 2/1994 | Wilson et al. ............... 330/278 |
| 5,397,934 A | | 3/1995 | Merrill et al. |
| 5,510,747 A | | 4/1996 | Williams |
| 5,559,368 A | | 9/1996 | Hu et al. |
| 5,602,790 A | | 2/1997 | Mullarkey |
| 5,610,533 A | | 3/1997 | Arimoto et al. |
| 5,612,566 A | | 3/1997 | Williams |
| 5,689,144 A | | 11/1997 | Williams |
| 5,748,016 A | | 5/1998 | Kurosawa |
| 5,753,955 A | | 5/1998 | Fechner |
| 5,767,733 A | | 6/1998 | Grugett |
| 5,942,940 A | | 8/1999 | Dreps et al. |
| 5,946,243 A | | 8/1999 | Sim |
| 6,049,496 A | | 4/2000 | Forbes et al. |
| 6,140,877 A | | 10/2000 | Forbes et al. |
| 6,213,869 B1 | | 4/2001 | Yu et al. |
| 6,218,892 B1 | * | 4/2001 | Soumyanath et al. ....... 327/537 |
| 6,225,846 B1 | | 5/2001 | Wada et al. |
| 6,225,852 B1 | | 5/2001 | Cleveland et al. |
| 6,232,793 B1 | | 5/2001 | Arimoto et al. |
| 6,362,687 B2 | * | 3/2002 | Cox ............................. 330/253 |
| 6,362,690 B1 | * | 3/2002 | Tichauer ...................... 330/284 |
| 6,441,677 B1 | * | 8/2002 | Kaiser et al. ................ 327/534 |
| 6,509,589 B1 | | 1/2003 | Tichauer et al. |
| 6,597,898 B1 | * | 7/2003 | Iwata et al. .................. 330/129 |
| 6,614,301 B2 | * | 9/2003 | Casper et al. ............... 330/253 |

* cited by examiner

*Primary Examiner*—Khanh V. Nguyen
(74) *Attorney, Agent, or Firm*—Townsend and Townsend and Crew LLP (57) ABSTRACT

Embodiments of the present invention include an amplification system and method of controlling an amplifier. The method comprises receiving a first digital signal representing a desired amplifier signal level, receiving a portion of said amplifiers output signal, and adjusting the voltage on a body terminal of said amplifier so that the output signal is maintained in a predetermined range. The amplification system comprises an MOS amplifier wherein the body terminal is adjusted to maintain the output at desired levels. In one embodiment, the body terminal is a fine adjust, and an input attenuator is used for a coarse adjust. In another embodiment, input and output couplers are coupled to the amplifier, and portions of the input and output signals are used to adjust the body terminal to maintain a desired output level.

16 Claims, 7 Drawing Sheets

AMPLIFIER CIRCUIT AND METHOD

BACKGROUND

The present invention relates to electronic circuits and systems, and more particularly, to electronic circuits and systems including amplifier circuits and methods of operating the amplifier circuits.

Amplifier circuits and methods find many applications in electronic systems. For example, amplifier circuits are widely used in wireless communication devices such as pagers, cellular phones, or cellular base stations to process various analog signals within the system. The function of an amplifier is to increase the power, voltage, or current of signals received at the amplifiers input or inputs. One common application of an amplifier circuit is for transmission of a Radio Frequency (RF) signal. For example, many wireless communication systems require a power amplifier to drive the antenna of the system, thereby transmitting information contained in the amplified signals into the airwaves.

Figure 1:
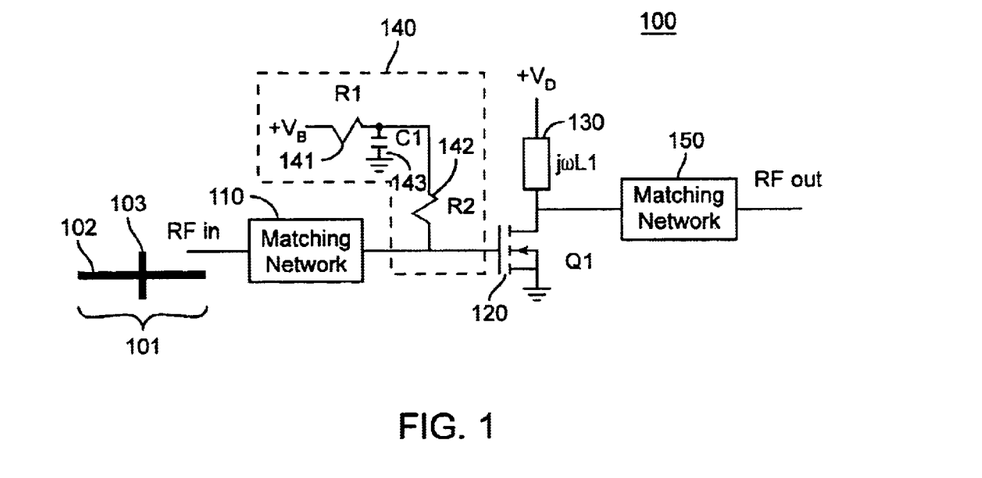
FIG. 1 illustrates a conventional MOS amplifier.

FIG. 1 illustrates a conventional MOSFET RF amplifier 100 for amplifying the power of an RF signal. The amplifier circuit 100 includes an input matching network 110, a MOS transistor 120, a load 130, a bias network 140, and an output matching network 150. The bias network includes a pair of resistors 141 and 142 connected in series between a fixed bias voltage $+V_B$ and the gate of MOS transistor 120. The first terminal of a capacitor 143 is connected to the node between resistors 141 and 142, and the second terminal of the capacitor 143 is connected to ground.

Figure 2:
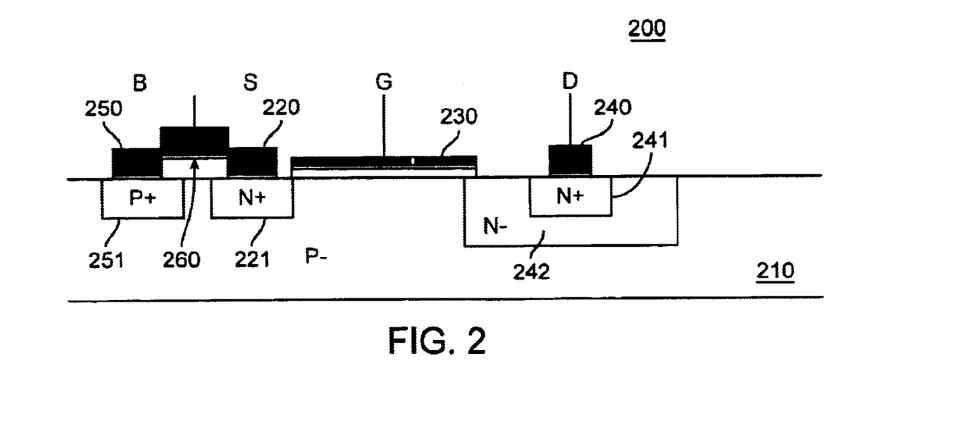
FIG. 2 illustrates a conventional MOS transistor structure.

FIG. 2 illustrates a conventional N-channel MOS transistor structure 200 that may be used in the amplifier circuit of FIG. 1. MOS transistor 200 includes a body region comprising a P-type substrate 210, a N-type source region 221, a gate 230, and an N-type drain region comprising N− region 242 and N+ region 241. The drain, source, and body regions include electrical contacts 240, 220, and 250, respectively. In typical amplifier designs using MOS or equivalent devices, the body is electrically connected to the source. A common technique for establishing the source to body connection is a polysilicon connection 260 between the source contact 220 and body contact 250. Thus, in typical amplifier designs, the body is maintained at the same voltage as the source.

The circuit shown in FIG. 1 is representative of a single MOSFET amplifier stage. This can be considered a single ended stage or half of a balanced stage. Load 130 may comprise an inductor, shown as jωL1, which may have a high impedance at the circuit's frequency of operation. As is the case with inductors, any sudden change in current will cause a voltage of opposite polarity to be generated. The magnitude of this voltage will be proportional to di/dt.

Also shown in FIG. 1 is an input signal 101. Input signal 101 includes a first amplitude signal portion defining a first signal envelope 102, and a brief large amplitude pulse portion defining a second signal envelope 103. Such signals may be common in a variety of electronic systems. For example, in a wireless communication system, such signals may occur when the various wavelengths in an encoded signal constructively interfere. Signals including brief pulse envelopes are problematic to amplifiers because, typically, the amplifier is biased to handle the smaller envelope 102. Thus, the bias current drawn by amplifier circuit 100 will be primarily determined by the smaller constant amplitude signal. However, when a large amplitude pulse is received, there will be a definite di/dt present across the inductor. The magnitude of the di/dt will depend on the slope of the large amplitude pulse. A large slope will typically cause a large voltage to appear across the inductor, and thus, the output of the amplifier will clip at the supply voltage. Accordingly, any information carried in the input signal 101 may be lost or severely distorted.

Another problem with conventional amplifier circuits and methods is that various electronic system applications, such as wireless communication systems, for example, have an ever increasing requirement that the amplifiers include more functionality and improved performance. For example, electronic systems may require amplifier circuits or methods that have variable gains, wide bandwidths, process or temperature compensation, improved linearity, or power efficiency.

Accordingly, amplifier circuits and methods that have improved performance and increased functionality are desirable for modem electronic systems.

SUMMARY

Embodiments of the present invention include an amplification system and method of controlling an amplifier. The method comprises receiving a first digital signal representing a desired amplifier signal level, receiving a portion of said amplifiers output signal, and adjusting the voltage on a body terminal of said amplifier so that the output signal is maintained in a predetermined range. The amplification system comprises an MOS amplifier wherein the body terminal is adjusted to maintain the output at desired levels. In one embodiment, the body terminal is a fine adjust, and an input attenuator is used for a coarse adjust. In another embodiment, input and output couplers are coupled to the amplifier, and portions of the input and output signals are used to adjust the body terminal to maintain a desired output level.

In one embodiment, the present invention includes an amplification system comprising an MOS amplifier, a output coupler coupled to an output of the MOS amplifier, an attenuator coupled to an input of the MOS amplifier, and a conditioning circuit having a first input coupled to receive a digital signal representing a desired amplifier signal level, a second input coupled to an output of the coupler, and an output coupled to a body terminal of the MOS amplifier.

In another embodiment, the present invention includes a method of controlling an amplifier comprising receiving a first digital signal representing a desired amplifier signal level, receiving a portion of said amplifiers output signal, and adjusting the voltage on a body terminal of said amplifier so that the output signal is in a predetermined range.

A further understanding of the nature and advantages of the present invention may be realized by reference to the remaining portions of the specification and the drawings.

DETAILED DESCRIPTION

Embodiments of the present invention take advantage of the device physics of MOS and equivalent transistor structures to improve the functionality and performance of amplifier circuits, as well as the electronic systems in which such amplifier circuits are used. Additionally, some embodiments of the present invention provide techniques and configurations for amplifier circuits, and electronic elements coupled to the amplifier circuits, that may be used to improve signal processing in electronic systems such as wireless communication systems.

Figure 3A:
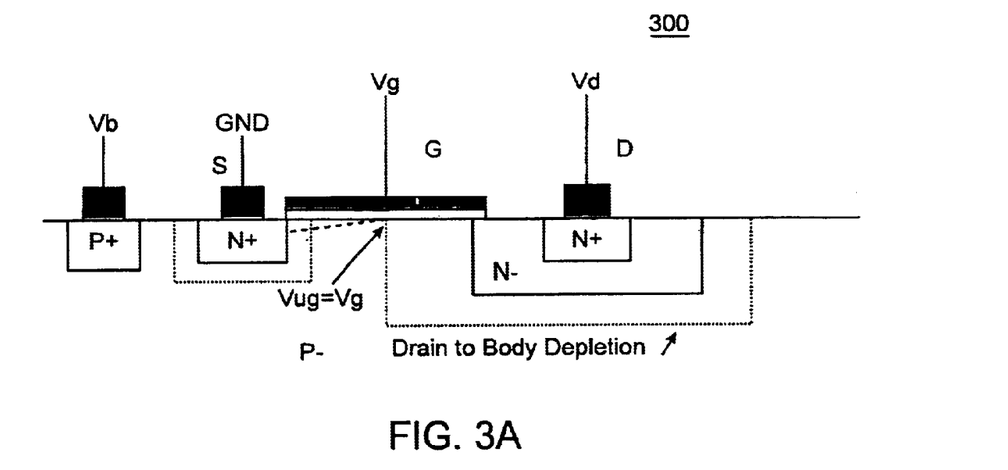
FIG. 3A illustrates a MOS transistor structure according to one embodiment of the present invention.

FIG. 3A illustrates a MOS transistor structure 300 according to one embodiment of the present invention. In MOS transistor structure 300, the body is no longer tied to the source. It is now capable of being biased to any voltage chosen by the designer. A dangerous situation may exist if the body potential ever exceeds the source potential. In this case the body to source diode would be forward biased and device performance will be degraded. It is also very important to make sure that any transient condition that may exist across the flyback diode found between the body and the drain have a low impedance path to ground.

The gate threshold voltage of the MOSFET is determined, to a large degree, by the source to body junction's characteristics. This is a complex function of doping profiles and parasitic resistance just to name a few factors. The threshold voltage can also be controlled by varying the body voltage. This effectively changes the depletion width of the source to body junction.

One characteristic of the I-V curve of a typical MOSFET is that at low gate to source bias the slope in the linear region is shallower, i.e., higher resistance than the traces for higher gate to source voltages. As can be seen in FIG. 3A, the conduction channel extends from the source to the edge of the drain to body depletion. The point at which these two regions intersect is where the voltage under the gate, Vug, which results from the current flowing in the channel multiplied by the resistance of the conduction region, equals the gate potential. This is because at this point, the voltage differential across an infinitely narrow section of the gate oxide is zero. At the source end of the conduction channel, the largest accumulation of charge will exist because, with the source at ground potential, the full potential of Vg is across that infinitely narrow section of the gate oxide. After this point there is current flow and a resultant voltage drop which means that a lesser amount of charge will accumulate in each ensuing infinitely narrow section.

Additionally, the drain to body depletion is determined by the drain potential and the body potential everywhere except at the immediate region of the interface between the oxide and the body. Only within the 50 to 100 angstroms of the semiconductor interface, where the conductive channel exists, is the voltage across the depletion equal to the drain voltage minus the gate voltage. At higher gate voltages the potential difference will be less than for a lower gate voltage. Additionally, for lower gate to source voltages the channel resistance is higher in the linear region where the drain to source voltage is low. This correlates with the fact that the transconductance is lower at the lower gate to source voltages in the saturated region than at the higher gate to source voltages.

The voltage under the gate at the point where the conduction region meets the drain depletion region is independent of the body bias voltage. However, the shape and subsequent composite resistance of the conduction region under the gate is dependent on the body voltage since the body bias voltage affects the threshold voltage. The change in threshold voltage has a relationship approximated by:

$$\Delta V_{th} \alpha (\Delta Vbs)^{1/n}$$

Where n is a function of doping and Vbs is the body to source voltage. Since the source is usually highly doped most of the depletion will take place on the lighter doped body side of the junction. Additionally, the drain current Id is a well know function of $V_{th}$. Therefore, the drain current may be changed by controlling the body terminal of a MOS transistor.

It should be noted that the relationship between $\Delta Vbs$ and $\Delta V_{th}$ is not 1:1. Therefore, establishing large changes in $V_{th}$ in order to change the drain current from one desired value to another may require even larger changes in Vbs. This is important because of the reverse breakdown voltage of the source to body diode. Doping concentrations must be taken into consideration when designing a device like this.

However, $V_{th}$ can be modulated by modulating Vbs, thereby modulating the drain current. One powerful advantage of modulating drain current via the body rather than the gate is that the drain to gate capacitance will remain the same regardless of the body voltage. This is important in matching the input of the MOSFET. It should be noted that the MOS transistor shown in FIG. 3A is an N-channel MOS transistor. However, P-channel transistors behave in an equivalent manner and may also be used in embodiments of the present invention.

Figure 3B:
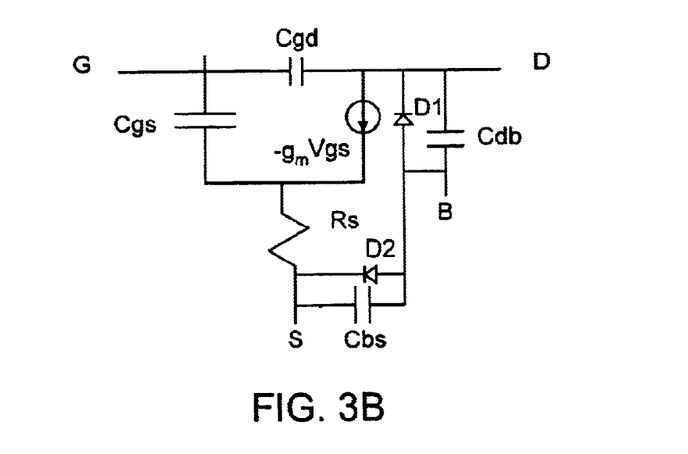
FIG. 3B illustrates an equivalent circuit of the MOS transistor of FIG. 3A according to one embodiment of the present invention.

FIG. 3B illustrates an equivalent circuit of the MOS transistor of FIG. 3A according to one embodiment of the present invention. The gate to drain capacitance is Cgd. This capacitance is primarily due to the portion of the gate oxide over the depleted portion of the conduction channel. Conversely, Cgs is the portion of the gate oxide over the undepleted portion of the induced conduction channel. Rs is the undepleted induced channel's resistance plus the contact resistance of the source metalization as well as any residual resistance in the highly doped region between the source metalization and the induced channel. For the most part this corresponds to the classical MOSFET equivalent circuit where $-g_m Vgs$ is the transconductance of the MOSFET. Cdb, the drain to body capacitance, is a first order body modulated FET variable. In the conventional MOSFET, Cdb is referred to as Cds since the body is shorted to the source. Additionally, there is a diode present between the body and the source. This diode and its junction capacitance, D2 and Cbs respectively, are usually shorted out when the body is connected directly to the source.

Figure 4:
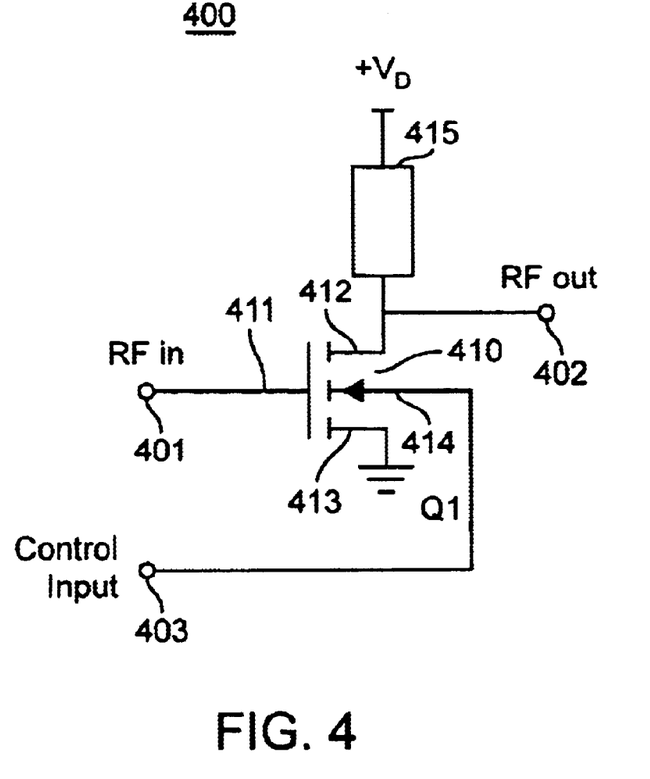
FIG. 4 illustrates an amplifier circuit according to one embodiment of the present invention.

FIG. 4 illustrates an amplifier circuit 400 according to one embodiment of the present invention. Amplifier 400 is a single ended stage, but a balanced configuration may be used in other embodiments discussed in more detail below.

Consequently, the configuration of FIG. 4 is illustrative of only one possible embodiment. Amplifier 400 includes MOS transistor 410 and a load 415. MOS transistor 410 includes a gate terminal 411, drain terminal 412, source terminal 413, and body terminal 414. Gate terminal 411 is coupled to amplifier input terminal 401 ("RFin"). Drain terminal 412 of MOS transistor 410 is coupled to load 415 and output terminal 402 ("RFout"), which forms the output of amplifier 400. Load 415 may form a complex load impedance $Z(j\omega)$ typically including inductance, such as an inductor L (e.g., $Z(j\omega)=-j\omega L$), for example. Another terminal of load 415 may be coupled to power supply +V.

The present invention provides a separate body terminal 414 of MOS transistor 410 coupled to a control input 403 that receives a body bias control signal. The control signal changes the body voltage of MOS transistor 410, and consequently the bias current of amplifier 400, in accordance with the input signal received at gate terminal 411. According to different embodiments, the bias current may be modified in different ways depending on the input signal. For example, in one embodiment, when there is no input signal, the control signal may be set to a voltage to reduce or completely shut off the bias current, and when there is an input signal, the control signal is set to a voltage to increase the voltage on body terminal 414 so that there is sufficient bias current in amplifier 400 to process the signal. In another embodiment, if the amplifier 400 receives envelopes with different maximum voltages, the control signal may be set to reduce the bias current when lower voltage envelopes are received, and the control signal may be set to increase the bias current when higher voltage envelopes are received. Accordingly, amplifier 400 has a lower or reduced bias current when the envelope of the input signal is low or off and a larger bias current when the envelope of the input signal is high (e.g., when a pulse occurs).

Amplifier circuits and methods that alter the body bias voltage are also disclosed in commonly-owned concurrently filed U.S. patent application Ser. No. 10/259,222, entitled "Amplifier Circuits and Methods," naming Larry Martin Tichauer as inventor, the disclosure of which is hereby incorporated herein by reference in its entirety.

In a conventional class A power amplifier, the final stage has a fixed bias current (i.e., a fixed quiescent or DC current). This means that the bias current is relatively constant whether a large signal or a small signal is processed by the power amplifier stage. Typically, bias current is set for the worst case situation since FCC inter-modulation product specifications must be adhered to. In other words, the amplifier must be able to handle the maximum potential signal power that can be received at the input to avoid transmitting a distorted signal over the airwaves. Therefore, a conventional amplifier system may change the attenuator value exclusively to control signal levels.

Embodiments of the present invention allow the bias current of the amplifier to be controlled by an attenuation word, rather than remaining fixed. Additionally, since there can be a fair amount of transconductance variation when the circuit's Q point is varied significantly, it may be desirable to have the ability to make a fine correction to the attenuator setting based on the output signal. Thus, embodiments of the present invention may allow the bias current of the amplifier to be controlled by the output signal level. Care must be taken not to induce any unwanted AM modulation on the signal or even worse, remove any intentional AM components of the signal. The complexity of the conditioning circuit will be determined by the system performance specification as well as the predictability, stability and linearity of the devices in the amplifier.

Figure 5:
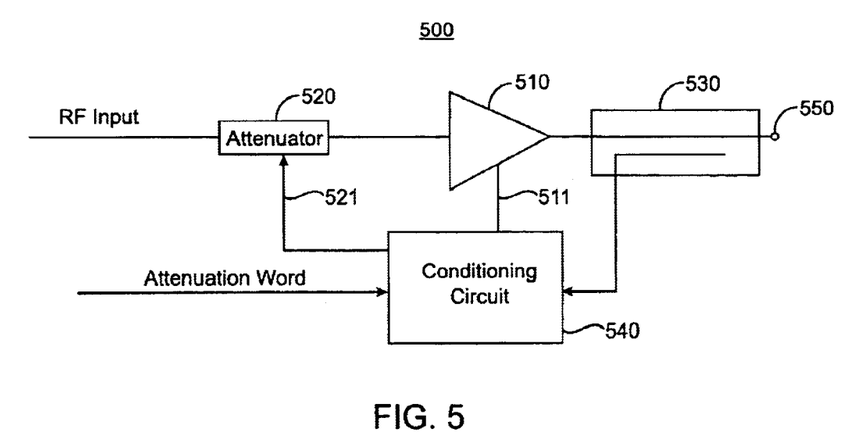
FIG. 5 illustrates a block diagram of an amplification system according to one embodiment of the present invention.

FIG. 5 illustrates a block diagram of an amplification system 500 according to one embodiment of the present invention. Amplification system 500 includes an MOS amplifier 510, attenuator 520, coupler 530, and conditioning circuit 540. Amplification system 500 adjusts the bias current in amplifier 510 based on both the attenuation word and output signal by adjusting the voltage on a body terminal of the amplifier so that the output signal is maintained in a predetermined range. However, other embodiments may only adjust the bias current in amplifier 510 based on only one of these parameters.

Attenuator 520 receives an RF input signal and attenuates the signal based on the value of attenuator control signal 521. The attenuated RF signal is then amplified by MOS amplifier 510 and provided to an output node 550 through coupler 530. Conditioning circuit 540 controls attenuator 520 and the bias current in amplifier 510 by generating attenuator control signal 521 and body control signal 511 in response to receiving an attenuator word and a portion of the output signal from coupler 530. Attenuator 520 may be a digitally controlled or analog controlled circuit. Consequently, conditioning circuit 540 may generate an analog or digital signal attenuator control signal 521 to change the attenuation of an amplifier input signal.

Figure 6:
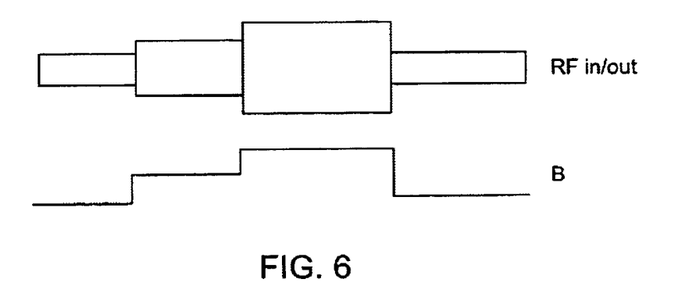
FIG. 6 illustrates an envelope for a signal that may be processed by an amplification system according to embodiments of the present invention.

FIG. 6 illustrates an envelope for a signal that may be processed by the amplification system 500 according to one embodiment of the present invention. For example, such an envelope may be found in a wireless communication system. Variable envelopes may be processed by amplification system 500 by adjusting either the attenuation or the amplifier biasing, or both, based on an input attenuation word. As shown in FIG. 6, the body control signal (i.e., body modulation signal), B, can be adjusted to correspond with the transmitted waveforms envelope. Accordingly, the amplifier can be operated at lower powers during smaller amplitude signal time periods by loading an attenuation word that programs conditioning circuit 540 to generate a lower voltage relative to ground on the body terminal (i.e., the magnitude of Vbs is increased), and the amplifier can be operated at higher powers during higher amplitude time periods by loading an attenuation word that programs conditioning circuit 540 to generate a higher voltage relative to ground on the body terminal (i.e., the magnitude of Vbs is decreased), thereby saving power and reducing distortion.

As the RF signal is transmitted junction temperatures in amplifier 510 will tend to rise. This heating lowers the mobility of the channel in MOS amplifier 510. This lower mobility in turn raises parasitic resistances, which lower the overall transconductance of the device. Consequently, the gain of amplifier 510, as well as the output signal, will decrease. Embodiments of the present invention compensate for decreases in the output signal (i.e., droop) by feeding back a portion of the output signal and adjusting either the attenuation control signal on line 521 or the body control signal on line 511, or both, to maintain the desired output level (i.e., maintaining a constant gain).

Figure 7:
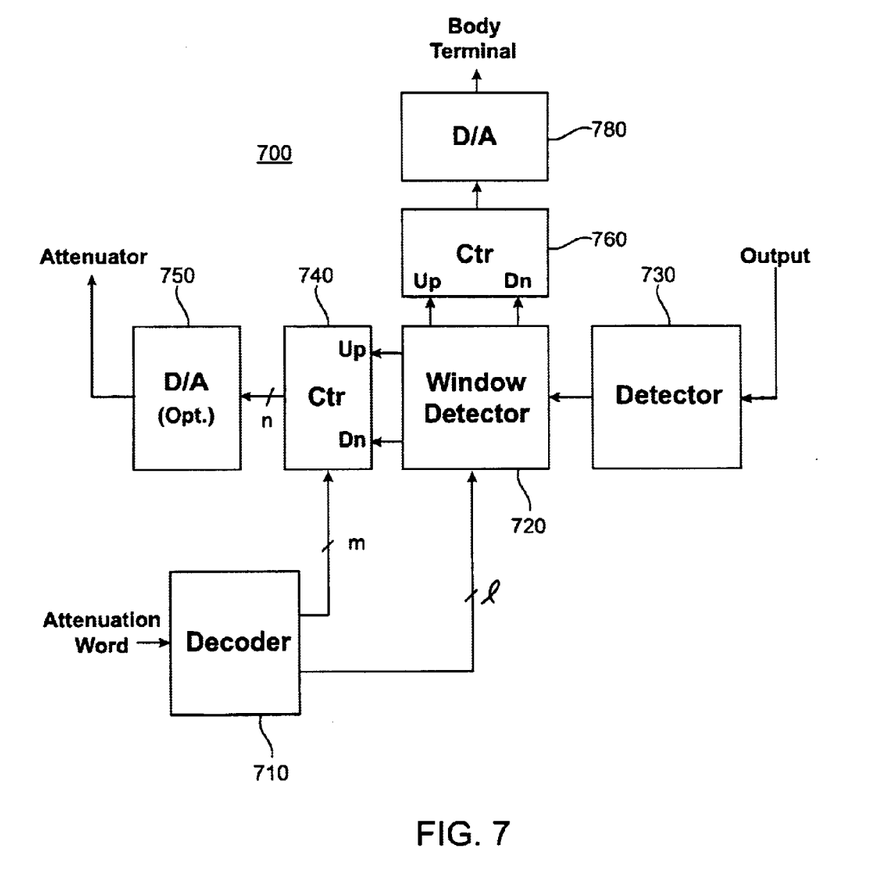
FIG. 7 illustrates a conditioning circuit according to one embodiment of the present invention.

FIG. 7 illustrates a conditioning circuit 700 according to one embodiment of the present invention. Conditioning circuit 700 receives an attenuation word in decoder 710. Decoder 710 may be a programmable read only memory ("PROM"), for example. The attenuation word is a digital signal representing the desired signal level of the amplifier (e.g., the desired power level). Decoder 710 generates two digital output signals "m" and "l." The first digital signal, "m," is a coarse adjust signal. The coarse adjust signal is loaded into counter 740, and the output of the counter is a digital attenuation control signal, "n," for controlling attenuator 520 of FIG. 5. If attenuator 520 is an analog attenuator, an optional digital-to-analog converter 750 may be included to receive the digital attenuation control signal "n" from counter 740 and translate the digital attenuation control signal into an analog attenuation control signal.

Decoder 710 also generates a reference word, "l," to act as a programmable reference for the window detector 720. Window detector 730 receives a second input from the output of coupler 530 of FIG. 5 through detector 730. Detector 730 may be an RF detector that receives a portion of an RF output signal from coupler 530, and generates a signal, such as a voltage, indicating the amplitude of the RF output signal (i.e., the level of the envelope). A portion of the output signal from coupler 530 is input to detector 730. The output of detector 730 is then compared to the reference word and, depending on deviations of the output signal from desired values, either the body terminal is adjusted (fine adjust) or the attenuator is adjusted (coarse adjust) to produce the desired output signal level. To control the body terminal, window detector 720 includes a counter 760 and digital-to-analog converter 780. For small variations in the output signal, window detector 720 will increment or decrement counter 760. The output of counter 760 is, in turn, converted into an analog control signal by digital-to-analog converter 780. Accordingly, small changes in the output signal will be corrected by changing the body terminal. For large variations in the output signal, window detector 720 will increment or decrement counter 740. The output of counter 740, in turn, controls attenuator 520. If a digital signal is required to control attenuator 520, then the output of counter 740 may be applied directly. However, if an analog signal is required, the output of counter 740 may be converted into an analog control signal by digital-to-analog converter 750. Accordingly, large changes in the output signal will be corrected by changing the attenuation of the input signal.

Figure 8:
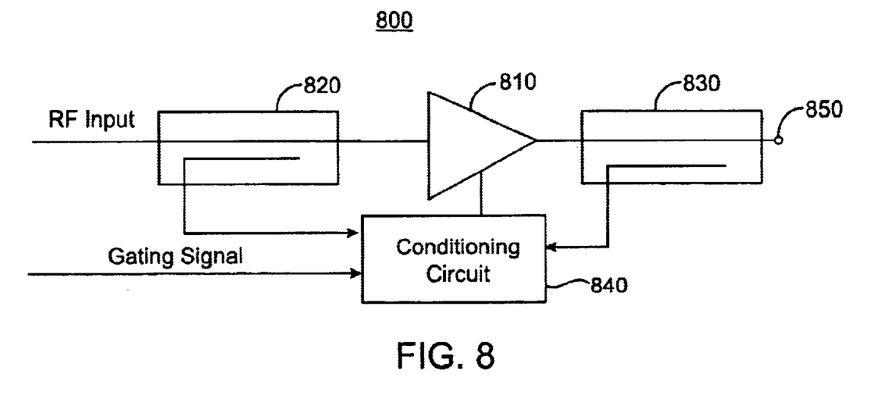
FIG. 8 illustrates an amplification system according to another embodiment of the present invention.

FIG. 8 illustrates an another embodiment of the invention that may be used compensate for gain variations of an amplifier. Amplification system 800 includes an MOS amplifier 810, input coupler 820, output coupler 830, and conditioning circuit 840. Input coupler 820 couples a portion of the input signal to conditioning circuit 840. Output coupler 830 couples a portion of the output signal to conditioning circuit 840. Conditioning circuit 840 monitors the input and output signals and adjusts the body terminal to maintain desired output signal levels (i.e., gain of amplifier 810).

One particular type of amplifier that may benefit from embodiments of the present invention is a pulse amplifier. A pulse amplifier is only turned on for finite periods of time ("on time") to deliver a signal, and after the signal is delivered, the amplifier is turned off. As "on times" of the amplifier (i.e., the pulse widths) increase (e.g. approach approximately 1 millisecond), junction temperatures tend to rise. This heating changes the gain of the amplifier, and consequently, the output signal level. Accordingly, when used in a pulse amplifier application, conditioning circuit 840 receives a gating signal to turn the amplifier on by adjusting the body terminal from a first voltage where the bias current is off to a second voltage where the bias current is sufficient for amplification.

Figure 9:
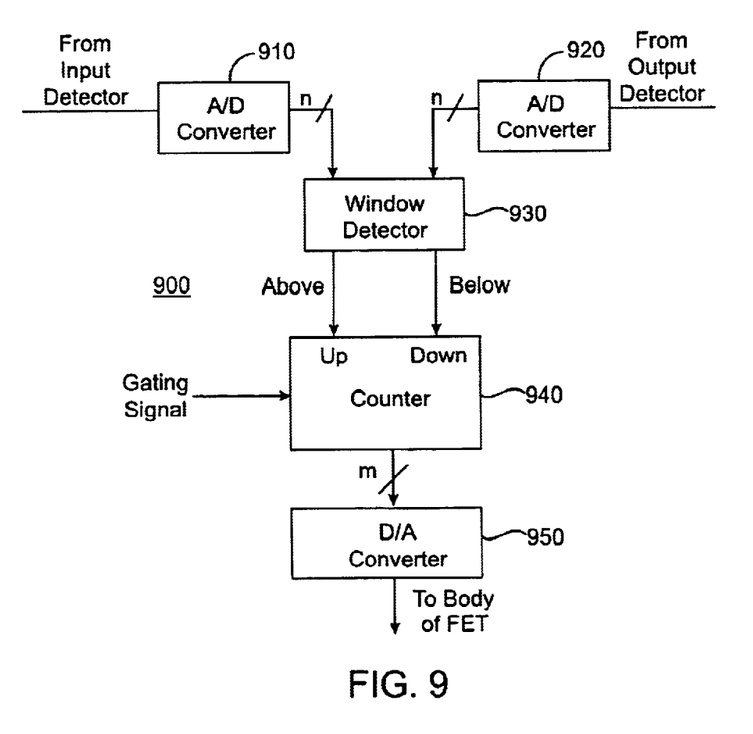
FIG. 9 illustrates a conditioning circuit for controlling the body bias of an MOS amplifier according to one embodiment of the present invention.

FIG. 9 illustrates a conditioning circuit 900 for controlling the body bias for use in the amplifier of FIG. 8 according to one embodiment of the present invention. The outputs of couplers 820 and 830 are received by conditioning circuit 900, and the envelopes of the input and output signals are processed so that the voltage on the body terminal, relative to ground, is increased when the output signal is too high and decreased when the output signal is too low. The RF input and output signal amplitudes (i.e., envelopes) may be detected using any type of RF detectors (not shown). Conditioning circuit 900 includes an analog-to-digital ("A/D") converter 910 receiving a detected input from input coupler 820 of FIG. 8. The input signals envelope level is sampled by an A/D converter and digitized to a resolution of n bits. A second analog-to-digital converter 920 receives a detected input from output coupler 830 of FIG. 8. The output signal is also sampled and digitized to n bits. Depending on the signal levels received from the couplers, it may be advantageous to include RF amplifiers on the coupler outputs before the RF signal envelopes are detected in RF detectors. Similarly, it may be advantageous to add amplifiers before the inputs of the A/D converters 910 and 920.

The output signal may be normalized, or scaled relative to the input signal, such that a comparison of the two signals is possible. Alternatively, the gain may be calculated and compared to an expected gain. The input and output signals of the amplifier are compared digitally in a window detector 930 (i.e., a digital comparator for comparing the actual gain to expected gain or for comparing the normalized input and output signals). When the two normalized signals are equal, the window detector will be inactive and the "Above" and "Below" signals will be at a logic "0" state. When the normalized detected output signal is above or below a certain predetermined percentage (i.e., a threshold) of the detected input signal, the window detector will become active. If the output signal is above a predetermined percentage of the input signal, window detector 930 signals the "DOWN" input of counter 940 and the counter will decrement one state. Conversely, if the output signal is below a predetermined percentage of the input signal, window detector 930 signals the "UP" input of counter 940 and the counter will increment one state. In gated amplifier applications, counter 940 may also include an input for receiving the gating signal. When the gating signal is low, the counter is disable the counter, and when the signal is high the counter is enabled. The output of counter 940 is coupled to the input of digital-to-analog ("D/A") converter 950, and the output of D/A converter 950 is coupled to the body terminal of a MOS transistor in amplifier 810. This will alter the threshold voltage of the device and cause an incremental increase or decrease in the transconductance of the device to occur. Consequently, when the output signal is too high, the count value is reduced, and the voltage on the body terminal is reduced relative to ground. Alternatively, when the output is too low, the count value is increase, and the voltage on the body terminal is increased relative to ground.

Conditioning circuit 900 may include an internal time-out in the window detector to allow the control loop to settle out before another sample is compared by the window detector. The speed of the loop should be such that no perceptible droop or rise should be observable in the output waveform. In addition, the granularity of the steps should be sufficiently small to make each adjustment imperceptible for the application at hand. It is to be understood that the circuit of FIG. 9 is only one exemplary technique for controlling the body bias. Those skilled in the art will realize that other equivalent circuits may also be used. For just one example, a pulse train or pulse width modulated signal coupled to low pass filter may also be used, rather than a D/A converter.

Figure 10:
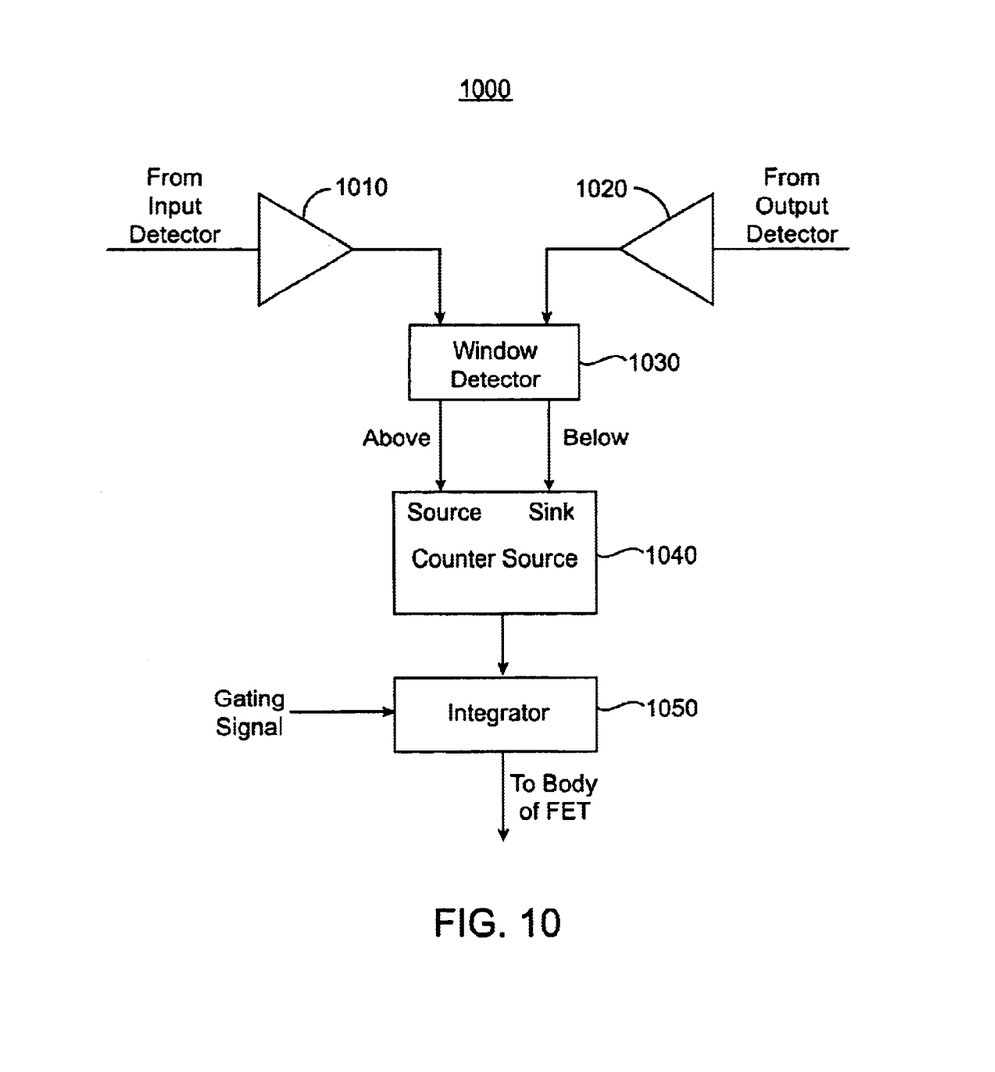
FIG. 10 illustrates a conditioning circuit for controlling the body bias of an MOS amplifier according to another embodiment of the present invention.

FIG. 10 illustrates a conditioning circuit 1000 for controlling the body bias for use in the RF amplifier of FIG. 8 according to another embodiment of the present invention.

The configuration shown in FIG. 10 is an analog control circuit. The output of coupler 820 is coupled to a first input of window detector 1030. The output of coupler 830 is coupled to a second input of window detector 1030. To obtain sufficient resolution at the window detector inputs, it may be necessary to add amplification to the envelope detectors. Accordingly, amplifiers 1010 and 1020 may optionally be included. The output signal may be normalized, or scaled relative to the input signal, so that the window detector will be able to compare the two signals in an analog format. The output of the window detector 1030 drives a charge pump current source 1040. The charge pump will either charge or discharge an integrator 1050 (e.g., a passive RC circuit or active integrator circuit) which will supply the bias to the body of the FET. In gated amplifier applications, integrator 1050 may also include an input for receiving the gating signal. When the gating signal is low, capacitors in the integrator may be discharged, thereby disabling the integrator, and when the signal is high the integrator is enabled.

In other embodiments, a hybrid analog and digital approach may be more desirable than a totally analog or digital implementation. In this case it may be desirable to digitally scale the signals such that the normalization process will not be affected by temperature or aging. As long as sufficient resolution is present, as required by the application, a very reliable and well behaved circuit can be implemented. It may be desirable to use the integrator instead of the D/A so that the adjustments are continuous rather than discrete in nature. In one embodiment, an RC low pass may be provided at the output of the D/A to smooth the transitions as well.

In one embodiment, the output couplers 530 of FIG. 5 and 830 of FIG. 8 may be printed directional couplers. Printed directional couplers can be manufactured on a printed circuit board common with other circuitry by a photolithographic process using a mask or direct write technology. By fine tuning a prototype, it is possible to incorporate any fine adjustments in the mask or direct write data file. This allows maximizing performance and repeatability while minimizing labor and cost. However, it is to be understood that discrete couplers may also be used.

Having fully described alternative embodiments of the present invention, other equivalent or alternative techniques will be apparent to those skilled in the art. These equivalents and alternatives along with the understood obvious changes and modifications are intended to be included within the scope of the present invention as defined by the following claims.

What is claimed is:

1. A method of controlling an amplifier comprising:
   receiving a first digital signal representing a desired amplifier signal level;
   receiving a portion of an output signal of said amplifier; and
   adjusting the voltage on a body terminal of said amplifier based on at least the first digital signal and the portion of the output signal of the amplifier so that the output signal is in a predetermined range.

2. The method of claim 1 further comprising generating a reference signal and comparing the portion of said amplifier output signal to the reference signal, and in accordance therewith, adjusting said voltage on the body terminal.

3. The method of claim 1 further comprising generating an attenuator control signal to change the attenuation of an input signal to said amplifier.

4. The method of claim 3 further comprising generating a reference signal and comparing the portion of said amplifiers output signal to the reference signal, and in accordance therewith, adjusting said attenuator control signal.

5. The method of claim 1 wherein the first digital signal has a first value when said amplifier receives an input signal having a first envelop level, and the first digital signal is changed to a second value when said amplifier receives an input signal having a second envelop level.

6. An amplification system comprising:
   an MOS amplifier;
   a output coupler coupled to an output of the MOS amplifier;
   an attenuator coupled to an input of the MOS amplifier; and
   a conditioning circuit having a first input coupled to receive a digital signal representing a desired amplifier signal level, a second input coupled to an output of the coupler, and an output coupled to a body terminal of the MOS amplifier the output providing a signal to the body terminal based on at least the digital signal and an output of the coupler.

7. The amplification system of claim 6 wherein when an output signal of the MOS amplifier changes, the conditioning circuit adjusts the voltage on the body terminal of the MOS amplifier.

8. The amplification system of claim 6 wherein the conditioning circuit further comprises a decoder for receiving and decoding the digital signal.

9. The amplification system of claim 8 wherein the decoder is a PROM.

10. The amplification system of claim 6 wherein the conditioning circuit further comprises a window detector that compares a reference word to an output of the coupler.

11. The amplification system of claim 10 wherein the conditioning circuit further comprises a digital-to-analog converter coupled to the body terminal of the MOS amplifier.

12. An amplification system comprising:
   an MOS amplifier having an input terminal, and output terminal, and a body terminal;
   an input coupler coupled to the input terminal of the MOS amplifier;
   an output coupler coupled to the output terminal of the MOS amplifier;
   a comparator circuit, coupled to outputs of the input coupler and output coupler to receive a portion of an input signal to the amplifier and a portion of an output signal from the amplifier based on at least the portion of the input signal and the portion of the output signal from the amplifier, the control signal being, the comparator circuit generating a control signal coupled to the body terminal to change the voltage on the body terminal in response to changes in the output signal level.

13. The amplification system of claim 12 further comprising a digital-to-analog converter coupled between the comparator and the body terminal.

14. The amplification system of claim 13 further comprising a counter coupled between the comparator and digital-to-analog converter.

15. The amplification system of claim 12 further comprising charge pump coupled between the comparator and the body terminal.

16. The amplification system of claim 15 further comprising integrator coupled between the comparator and the body terminal.

* * * * *